United States Patent
Salafsky et al.

(10) Patent No.: US 6,512,172 B1
(45) Date of Patent: Jan. 28, 2003

(54) POLYMER-NANOCRYSTAL PHOTO DEVICE AND METHOD FOR MAKING THE SAME

(75) Inventors: Joshua Samuel Salafsky, Utrecht (NL); Rudolf Emanuel Isidore Schropp, Driebergen (NL)

(73) Assignee: Universiteit Van Utrecht (NL)

( * ) Notice: Subject to any disclaimer, the term of this patent is extended or adjusted under 35 U.S.C. 154(b) by 0 days.

(21) Appl. No.: 09/554,178

(22) PCT Filed: Nov. 11, 1998

(86) PCT No.: PCT/EP98/07328

§ 371 (c)(1),
(2), (4) Date: Oct. 10, 2000

(87) PCT Pub. No.: WO99/25028

PCT Pub. Date: May 20, 1999

(30) Foreign Application Priority Data

Nov. 11, 1997 (EP) .............................. 97203499

(51) Int. Cl.[7] ..................... H01L 31/0384; H01L 51/20; H01L 51/30; H01L 33/00

(52) U.S. Cl. ...................... 136/263; 136/265; 136/252; 136/256; 429/111; 257/43; 257/40; 257/431; 438/82; 438/85; 438/104; 438/99

(58) Field of Search ................... 136/263, 265, 136/252, 256; 429/111; 257/43, 40, 431; 438/85, 82, 104, 99

(56) References Cited

U.S. PATENT DOCUMENTS 6,239,355 B1 * 5/2001 Salafsky et al. ............. 136/250
6,303,943 B1 * 10/2001 Yu et al. ....................... 257/40

OTHER PUBLICATIONS

Hide et al "Laser emission from solutions and films containing semiconductor polymer and titanium dioxide nanocrystals," Chemical Physics Letters, 256, pp. 424–430, Jul. 5, 1996.*

Greenham et al, "Charge separation and transport in conjugated–polymer/semiconductor–nanocrystal composites studied by photoluminescence quenching and photoconductivity," Physics Review B Condensed Matter, vol. 54, No. 24, pp. 17628–17637, Dec. 15, 1996.*

Carter et al, "Enhanced luminance in polymer composite light emitting devices," Appl. Phys. Lett., vol. 71. No. 9, pp. 1145–1147, Sep. 1, 1997.*

Salafsky et al, "Photoinduced charge separation and recombination in a conjugated polymer–semiconductor nanocrystal composite," Chemical Physics Letters, 290, pp. 297–303, Jul. 3, 1998.*

N.C. Greenham, et al., "Charge Separation and Transport in Conjugated–Polymer/Semiconductor–nanocrystal Composites Studied by Photoluminescence Quenching and Photoconductivity", *Physical Review, B. Condensed Matter*, vol. 54, No. 24, Dec. 15, 1996, pp. 17628–17637.

N.C. Greenham, et al., "Charge Separation and Transport in Conjugated Polymer/Cadmium Selenide Nanocrystal Composites Studied by Photoluminescence Quenching and Photoconductivity", *Synthetic Metals*, vol. 84, No. 1–3, Jan. 1, 1997, pp. 545–546.

(List continued on next page.)

*Primary Examiner*—Alan Diamond
(74) *Attorney, Agent, or Firm*—Ostrolenk, Faber, Gerb & Soffen, LLP

(57) ABSTRACT

Disclosed is a method of producing a photo device containing a layer of nanometer sized particles and a conducting polymer in solid sate, wherein the layer is made by mixing the nanometer sized particles in colloid with precursor polyparaphenylenevinylene or a derivative thereof and wherein the nanometer sized particle is selected from the group consisting of $TiO_2$, $ZnO$, $ZrO_2$ and $SnO_2$ and the layer is heated to a temperature during a period of time.

6 Claims, 1 Drawing Sheet

OTHER PUBLICATIONS

S.A. Carter, et al., "Enhanced Luminance in Polymer Composite Light Emitting Devices", *Applied Physics Letters*, vol. 71, No. 9, Sep. 1, 1997, pp. 1145–1147.

A. Kuczkowski, "The Prospects for Polyester Polymer–CDS Power Composites in Photoelectronic Device Applications", *Journal of Physics D. Applied Physics*, vol. 22, No. 11, Nov. 14, 1989, pp. 1731–1735.

J.J.M. Halls, et al., "Efficient Photodiodes from Interpenetrating Polymer Networks", *Nature*, vol. 376, Aug. 10, 1995, pp. 498–500.

J.S. Salafsky, et al., "Solid State Polymer–Semiconductor Nanocrystal Photovoltaic Devices", *2$^{nd}$ World Conference and Exhibition on Photovoltaic Solar Energy Conversion*, Jul. 6–10, 1998, Vienna, Austria, pp. 272–275.

* cited by examiner

POLYMER-NANOCRYSTAL PHOTO DEVICE AND METHOD FOR MAKING THE SAME

Especially for reducing costs for photovoltaic cells, research is done all around the world for finding a solid state composition of creating an interpenetrating solid-state conducting material in a nanoporous network. Such device could also be used for LED (Light Emitting Diodes), photo sensors, optical switches and even optical networks.

The present invention relates to a photo device comprising a layer of nanometer sized particles and a conducting polymer in solid state, wherein the nanometer sized particles are chosen from the group of $TiO_2$, ZnO, CdSe, CdS, $ZrO_2$ and $SnO_2$, and wherein the conducting polymer comprises PPV (polyparaphenylenevinylene) or a derivative thereof.

Prior methods have been published on the insertion of a polymer electrolyte into a preformed nanocrystalline $TiO_2$ (titanium dioxide) network (F. Cao et al., Proceedings of Nanostructured Materials in Electrochemistry, held: Reno, Nev., USA, 21–26 May 1995). These methods have, however, the disadvantage of being based on an ionic conductor. The device performance is therefore limited. The ionic conductor is not suited for electronic devices.

Another prior method using conducting polymers (PPV and derivatives) replaces the inorganic nanocrystalline network with $C_{60}$ and derivatives which act as electron-acceptors (G. Yu et al., Science 270 (1995) 1789). However, in this method, the electron transport is restricted. Further, $C_{60}$ is not a material which is produced abundantly, and is expensive; it is also much less stable than inorganic materials.

Another prior method using a conjugated polymer, poly (2-methoxy, 5-(2'-ethyl)-hexyloxy-p-phenylenevinylene; MEH-PPV), incorporates nanoparticles of CdS or CdSe (N. C. Greenham et al., Physical Review B. Condensed Matter, 54 (1996) 17628, N. C. Greenham et al., Synthetic Metals 84 (1997) 545–546), but the cadmium-containing compounds have a disadvantage in that they are carcinogenic and also not abundantly available.

Another publication (S. A. Carter et al., Applied Physics Letters 71 (1997) 1145) discloses the use of $TiO_2$ nanoparticles blended with electroluminescent organic material in light emitting diodes. As an example, MEH-PPV was tested as organic material. The mixtures were spin cast onto an Ito coated glass, whereafter the solvent was evaporated off. The device lacks photovoltaic properties.

The present invention has for its object to offer a solution to the problem of creating an interpenetrating solid-state conducting material in a nanoporous network, for the purpose of creating stable, all-solid state photovoltaic cells. The instability problems associated with liquid based electrolytes in nanoporous networks (B. O'Regan et al., Nature, 353 (1991) p737) are to be avoided.

A further object of the present invention is to offer a photovoltaic cell, which offers the stability, electron transporting properties, the abundant availability, the low costs, and the no-toxicity of $TiO_2$ in an interconnected network in combination with the hole-transporting, light-absorbing, stable properties of PPV (poly-paraphenylenevinylene).

A further aspect of the present invention is the ease of manufacturing, namely in a single thermal treatment of the inorganic and organic materials together. The thermal treatment is elegantly simple, and provides for converting the polymer precursor to its final, conducting form as well, as for producing electrical contact between the inorganic nanometer sized particles to make continuous electron-carrying pathways to the end terminal of the photovoltaic cell, the object of the present invention.

None of the above prior art methods use a mixture of a polymer precursor in solution and inorganic nanometer sized particles in a colloidal solution to produce an interpenetrating composite layer in a single step of thermal treatment.

A preferred embodiment of the method according to the present invention uses a conducting polymer precursor (poly (p-xylene-alpha-tetrahydrothiophene-bromide; p-PPV) and a nanocrystalline material, $TiO_2$.

Another preferred embodiment of the method of the present invention is that the mixture of PPV precursor or derivative there of and $TiO_2$ is between 10:90 and 70:30 by weight, preferably approximately 50:50.

BRIEF DESCRIPTION OF THE DRAWINGS

Further advantages, features and details of the present invention are elucidated in the following description, which refers to the enclosed figures, in which.

Figure 1:
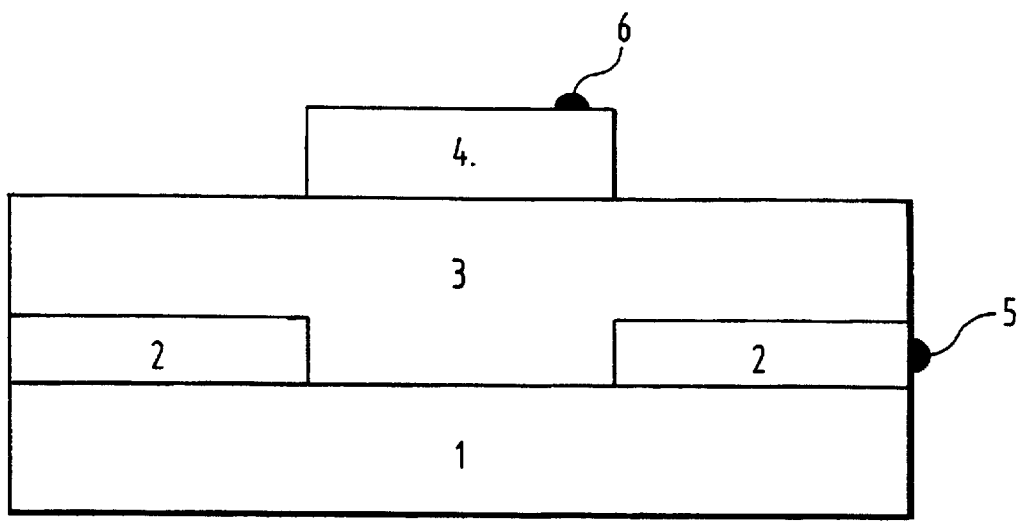
FIG. 1 is a diagrammatic cross section view of a device according to the present invention.

A schematic cross section of the cell is shown in FIG. 1. The polymer p-PPV was made by chemical synthesis (J. J. M. Halls et al., Nature 376 (1995) 498), the $TiO_2$ nanocrystals were obtained from Degussa AG Corporation, Germany. An approximately 0.7% methanolic solution of the p-PPV was combined with a colloid of $TiO_2$ (the colloid had been made according to Nazeeruddin et al., J. Am. Chem. Soc. 115 (1993) 6382), to give a mixture of approximately 1:1 p-PPV and $TiO_2$ by weight. This mixture was spin-coated on a glass substrate 1 with a transparent conducting coating 2, in this example $SnO_2$:F, to give a thin film 3. The film was heated to 320° C. for ten hours in vacuum and an aluminum contact 4 was evaporated in such a way that there was no overlap with the transparent conducting coating on the glass on top of the film to complete the cell.

Figure 2:
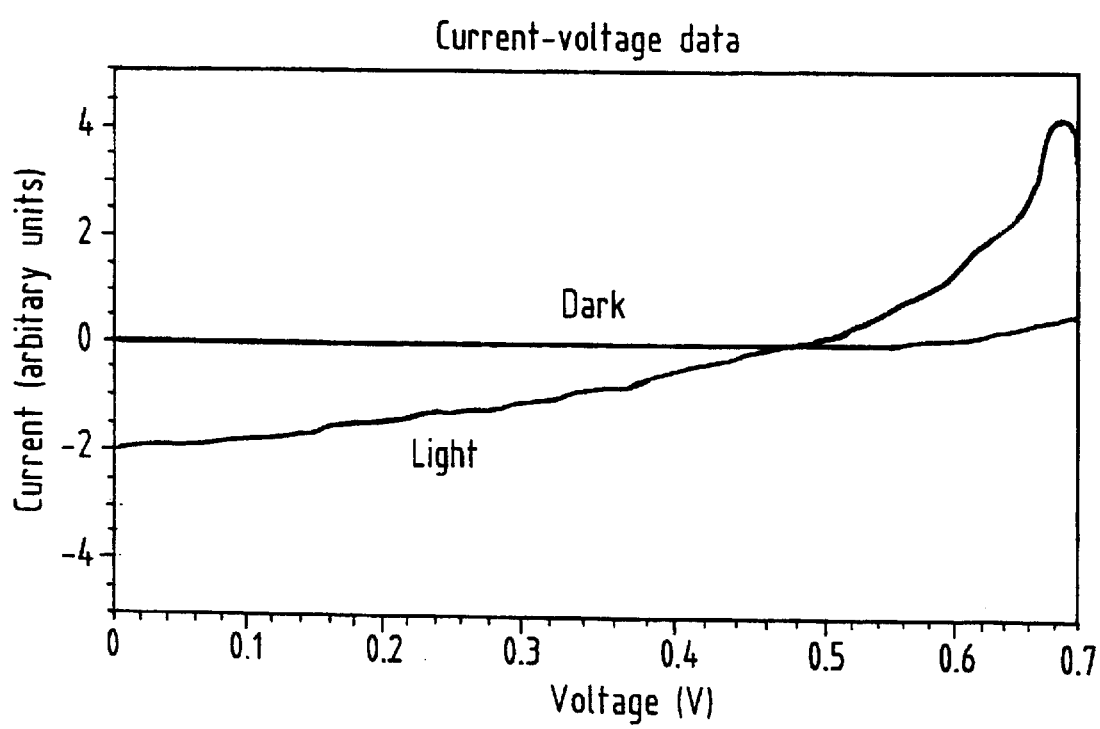
FIG. 2 is a graph of current voltage characteristic of the device of FIG. 1.

Current-voltage (IV) curves of the cells in the dark and in substantially white light were measured at terminal 5 and 6 (FIG. 1) and a plot of this data is shown in FIG. 2 which demonstrates that the cells produce electric power under illumination.

At least the thermal treatment step of the present invention is novel and inventive over the prior art. This step provides for both conversion of the p-PPV to its conducting form, PPV and for producing electrical contact between the $TiO_2$ particles to produce electron-carrying paths through the film.

The method according to the present invention allows the use of precursor polymer and thus does not require the complex process of first synthesizing MEH-PPV before blending with nanoparticles. Moreover, the method, by starting from a mixture of a colloid of $TiO_2$ and a solution of p-PPV, also provides a solution to the very poor penetration of conducting polymers with high molecular mass into a preformed porous nanocrystalline semiconductor.

The present method is first in making operational photovoltaic cells of a conducting polymer, such as PPV, and a sintered electrically interconnected network of nanocrystalline particles, such as $TiO_2$.

PPV has been shown to be a good hole-conducting material and $TiO_2$ an excellent electron transporter, so their combination together, prepared in a single thermal treatment step, provides a significant advantage.

The present invention is not limited to the embodiment described; the rights applied for are defined in the annexed set of claims; the scope of protection includes other polymers and nanocrystals, as well as other temperatures.

What is claimed is:

1. A method of producing a photo device, comprising a layer of nanometer sized particles and a conducting polymer in solid state, characterized in that the layer is made by mixing the nanometer sized particles in a colloid with precursor PPV (polyparaphenylene-vinylene) or a derivative thereof, the nanometer sized particles being selected from the group consisting of $TiO_2$, $ZnO$, $ZrO_2$, $SnO_2$ and mixtures thereof, wherein the layer is heated to a temperature during a period of time.

2. A method according to claim 1, wherein the precursor PPV or derivative thereof is poly(p-xylene-alpha-tetrahydrothiophene bromide) and the nanometer sized particles consist of $TiO_2$.

3. A method according to claim 2, wherein the mixture of $TiO_2$ and poly(p-xylene-alpha-tetrahydrothiophene bromide) is between 10:90 and 70:30 by weight.

4. A method according to claim 1 wherein the heating takes place under pressure of an inert gas or under vacuum.

5. A photo device produced by the method of claim 1, wherein the layer is a thin film of a photo voltaic cell.

6. A method according to claim 2, wherein the mixture of $TiO_2$ and poly(p-xylene-alpha-tetrahydrothiophene bromide) is about 50:50 by weight.

* * * * *